United States Patent
Woo et al.

(10) Patent No.: US 8,159,037 B2
(45) Date of Patent: Apr. 17, 2012

(54) STACK STRUCTURE COMPRISING EPITAXIAL GRAPHENE, METHOD OF FORMING THE STACK STRUCTURE, AND ELECTRONIC DEVICE COMPRISING THE STACK STRUCTURE

(75) Inventors: Yun-sung Woo, Suwon-si (KR); Sun-ae Seo, Hwaseong-si (KR); Dong-chul Kim, Suwon-si (KR); Hyun-jong Chung, Hwaseong-si (KR); Dae-young Jeon, Mokpo-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 14 days.

(21) Appl. No.: 12/230,487

(22) Filed: Aug. 29, 2008

(65) Prior Publication Data

US 2009/0294759 A1    Dec. 3, 2009

(30) Foreign Application Priority Data

May 29, 2008    (KR) .................... 10-2008-0050467

(51) Int. Cl.
  *H01L 21/02*    (2006.01)
(52) U.S. Cl. ......... 257/410; 428/641; 117/951; 438/496
(58) Field of Classification Search .................. 428/641; 117/951
See application file for complete search history.

(56) References Cited

U.S. PATENT DOCUMENTS

| | | | |
|---|---|---|---|
| 5,112,699 A * | 5/1992 | Chang | ............................ 428/641 |
| 2004/0253820 A1 * | 12/2004 | DeHeer et al. | ................. 438/689 |
| 2007/0187694 A1 | 8/2007 | Pfeiffer | |
| 2007/0284557 A1 | 12/2007 | Gruner et al. | |
| 2007/0287011 A1 | 12/2007 | DeHeer | |
| 2008/0031804 A1 | 2/2008 | Taki et al. | |

FOREIGN PATENT DOCUMENTS

| | | | |
|---|---|---|---|
| JP | 2006216874 A * | 8/2006 | |
| JP | 2007-335532 | 12/2007 | |

OTHER PUBLICATIONS

Electronic Devices from Nanopatterned Epitaxial Graphite obtained from http://web.archive.org/web/20080514201114/http://web.chemistry.gatech.edu/~orlando/epicslab/graphene.html . Written by the Electron and Proton Induced Chemistry on Surfaces Lab of Georgia Tech. Published on or before Jan. 1, 2008 and indexed by archive.org by May 14, 2008.*
Machine Translation of JP-2006216874. Generated Apr. 5, 2010.*
"Substrate-induced band gap in graphene on hexagonal boron nitride: Ab initio density functional calculations" to Giovannetti et al., Aug. 16, 2007 in Physical Review B 76, 073103.*

(Continued)

*Primary Examiner* — Thao Le
*Assistant Examiner* — Allen Parker
(74) *Attorney, Agent, or Firm* — Harness, Dickey & Pierce, PLC

(57) ABSTRACT

Provided are a stack structure including an epitaxial graphene, a method of forming the stack structure, and an electronic device including the stack structure. The stack structure includes: a Si substrate; an under layer formed on the Si substrate; and at least one epitaxial graphene layer formed on the under layer.

17 Claims, 7 Drawing Sheets

OTHER PUBLICATIONS

"Synthesis of One Monolayer of Hexagonal Boron Nitride on Ni(111) from B-Trichloroborazine (ClBNH)3" to Awuwarter et al. in Chemistry of Materials, 2004, 16 (2), pp. 343-345.*

Jiang et al. Thin Solid Films 315 (1998) 13-16. "Epitaxial growth of Cu(111) films on Si(110) by magnetron sputtering: orientation and twin growth". 1998.*

Konno et al. "Heteroepitaxial Growth of 3C-SiC(111)on Si(110) Substrate Using Monomethylsilane". MA2006-02, Oct. 29-Nov. 3, 2006 , Cancun, Mexico E10—Wide Bandgap Semiconductor Materials and Devices 7.*

Song. "Fabrication and Characterization of Nanopatterned Epitaxial Graphene Films for Carbon Based Electronics". Dissertation Nov. 9, 2006. Georgia Institute of Technology. Excerpt including pp. 105-107. Full text at http://hdl.handle.net/1853/13943.*

* cited by examiner

◯ : Si
◉ : Cu

◯ : Si
◉ : Cu

STACK STRUCTURE COMPRISING EPITAXIAL GRAPHENE, METHOD OF FORMING THE STACK STRUCTURE, AND ELECTRONIC DEVICE COMPRISING THE STACK STRUCTURE

PRIORITY STATEMENT

This application claims the benefit of Korean Patent Application No. 10-2008-0050467, filed on May 29, 2008 in the Korean Intellectual Property Office, the disclosure of which is incorporated herein in its entirety by reference.

BACKGROUND

1. Field

The present invention relates to an electronic device, and more particularly, to a stack structure comprising an epitaxial graphene, a method of forming the stack structure, and an electronic device including the stack structure.

2. Description of the Related Art

Graphene is a hexagonal single-layer structure formed of carbon atoms. Graphene is chemically very stable, and has characteristics of a semi-metal in which a conduction band and a valence band are overlapped with only at one point, that is, at a Dirac point. Also, graphene shows 2-dimensional ballistic transport. A 2-dimensional ballistic transport of a charge in a medium, means that a charge is transported in a medium without resistance due to scattering. Accordingly, the mobility of charges in graphene is very high. In addition, graphene has a current density of 100 times or greater than copper, that is, about $10^8$ A/cm$^2$.

Due to these characteristics of graphene, research has been conducted to use graphene in various electronic devices. However, due to the difficulty of the process of manufacturing graphene, it is not easy to manufacture electronic devices including graphene structures. In detail, for example, graphene is manufactured using an exfoliation method. In the exfoliation method, single crystal graphite is bonded on a top surface of an insulating layer, and a portion of graphite, that is, graphene, is attached on the insulating layer via the Van der Waals' force therebetween. However, when using this method, it is difficult to adjust the number, position, and width of graphene layers, since the method basically expects a coincidence, and it is also difficult to obtain a large-surface graphene layer. Alternatively, a growth method of growing a graphene layer on a compound single crystal substrate has been suggested; however, the compound single crystal substrate is expensive, and it is difficult to manufacture a large-surface compound single crystal substrate. In addition, the type of the compound single crystal substrate on which a graphene layer can be grown is very limited, and it is not easy to apply the compound single crystal substrate to most manufacturing processes of electronic devices.

SUMMARY OF THE INVENTION

An aspect of the present invention provides a stack structure including an epitaxial graphene and a method of forming the stack structure.

An aspect of the present invention also provides an electronic device including the stack structure.

According to an aspect of the present invention, there is provided a stack structure comprising: a Si substrate; an under layer formed on the Si substrate; and at least one epitaxial graphene layer formed on the under layer.

The under layer may be a hexagonal boron nitride (h-BN) (0001) layer.

The stack structure may further comprise a Ni(111) layer between the Si substrate and the under layer.

The stack structure may further comprise a Cu(111) layer between the Si substrate and the Ni(111) layer.

The Si substrate may be a Si(111) substrate or a Si(110) substrate.

The under layer may be a 3C—SiC(111) layer. In this case, the Si substrate may be a Si(111) substrate.

According to another aspect of the present invention, there is provided a method of forming a stack structure, the method comprising: forming an under layer on a Si substrate; and growing at least one epitaxial graphene layer on the under layer.

According to another aspect of the present invention, there is provided an electronic device comprising the stack structure according to one or more embodiments of the present invention.

The electronic device may include the at least one epitaxial graphene layer as a channel layer.

The transistor may comprise: a source and a drain each contacting different ends of the channel layer; a gate insulating layer formed on the channel layer; and a gate electrode formed on the gate insulating layer.

The transistor may comprise a source and a drain each contacting different ends of the channel layer, wherein the under layer is used as a gate insulating layer, and the Si substrate under the gate insulating layer is used as a gate electrode.

The transistor may further comprise: a source and a drain each contacting different ends of the channel layer; and a conductive layer formed between the Si substrate and the under layer to be used as a gate electrode, wherein the under layer is used as a gate insulating layer.

The transistor may further comprise: a source and a drain each contacting different ends of the channel layer; and a conductive layer between the Si substrate and the under layer, wherein the under layer is used as a gate insulating layer, and the conductive layer and the Si substrate under the conductive layer are used as gate electrodes.

The source and the drain may be formed of the same material as the channel layer and on the under layer, and the width of the channel layer may be smaller than the widths of the source and the drain.

The under layer may be a hexagonal-boron nitride(h-BN) (0001) layer. The Si substrate may be a Si(111) substrate or a Si(110) substrate.

The under layer may be a 3C—SiC(111) layer. In this case, the Si substrate may be a Si(111) substrate.

The under layer may be a hexagonal-boron nitride(h-BN) (0001) layer, and the conductive layer may comprise a Ni(111) layer. The conductive layer may further comprise a Cu(111) layer under the Ni(111) layer.

The at least one epitaxial graphene layer may be used as a wiring, an electrode, an inductor, or a sensor layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EXAMPLE EMBODIMENTS

Figure 1:
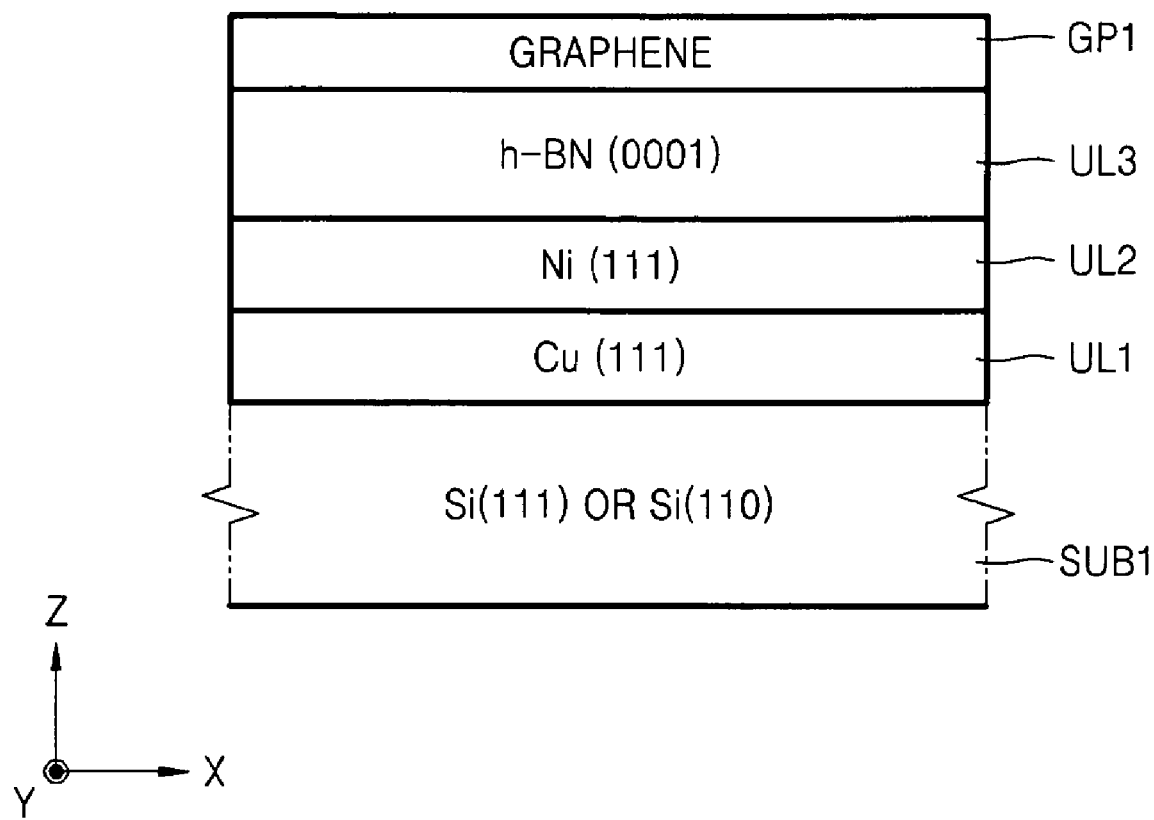
FIG. 1 is a cross-sectional view of a stack structure according to an embodiment of the present invention.

Various example embodiments will now be described more fully with reference to the accompanying drawings in which some example embodiments are shown. In the drawings, the thicknesses of layers and regions are exaggerated for clarity.

Detailed illustrative example embodiments are disclosed herein. However, specific structural and functional details disclosed herein are merely representative for purposes of describing example embodiments. This invention, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In the drawings, the thicknesses of layers and regions are exaggerated for clarity. Like reference numerals in the drawings denote like elements.

FIG. 1 is a cross-sectional view of a stack structure according to an embodiment of the present invention.

Figure 2A:
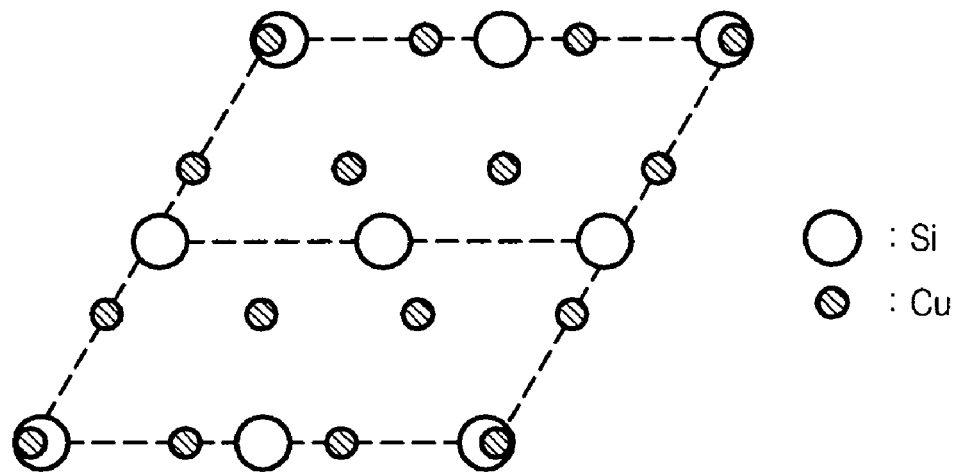
FIGS. 2A and 2B illustrate the atomic arrangement on an interface between a Si substrate and a Cu(111) layer of FIG. 1.
Figure 2B:
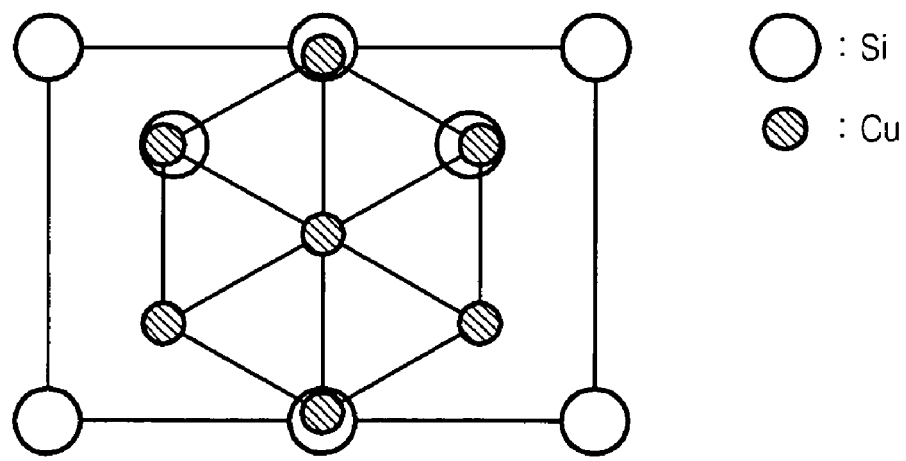

Referring to FIG. 1, a first under layer UL1, a second under layer UL2, and a third under layer UL3 are sequentially formed on a Si substrate SUB1, and at least one graphene layer GP1 is formed on the third under layer UL3. The Si substrate SUB1 may be a single crystal substrate, and may be a doped region with conductive impurities or an undoped region. A crystal plane that is parallel to an XY plane of the Si substrate SUB1 may be (111) or (110). A Si substrate SUB1 having a crystal plane (111) that is parallel to the XY plane is denoted as Si(111) substrate, and similarly, a Si substrate SUB1 having a crystal plane (110) parallel to the XY plane is denoted as Si(110) substrate. Such marking also applies to other materials to be described hereinafter. That is, a plane index "(XXX)" or "(XXXX)" after a "material" denotes the crystal plane of the "material", which is parallel to the XY plane. The first under layer UL1 may be a metal layer that is epitaxially grown on the Si substrate SUB1, for example, a Cu(111) layer. The atom arrangement on the interface between the Si substrate SUB1 and the Cu(111) layer may be as illustrated in FIGS. 2A and 2B. In FIG. 2A, the Si substrate SUB1 is a Si (111) substrate, and in FIG. 2B, the Si substrate SUB1 is a Si(110) substrate. As illustrated in FIGS. 2A and 2B, the Cu(111) layer may be epitaxially grown on the Si(111) substrate or the Si(110) substrate.

Referring to FIG. 1 again, the second under layer UL2 may be a metal layer that is epitaxially grown on the first under layer UL1, for example, a Ni(111) layer. The Cu(111) layer of the first under layer UL1 and the Ni(111) layer of the second under layer UL2 both have a FCC (face centered cubic) structure. Also, a lattice constant $a_{Cu-Cu}$ of the Cu(111) layer is 2.557 Å, and a lattice constant $a_{Ni-Ni}$ of the Ni(111) layer is 2.492 Å, which are similar to each other. Accordingly, the Ni(111) layer may be epitaxially grown on the Cu(111) layer.

The third under layer UL3 may be an insulating layer that is epitaxially grown on the second under layer UL2, for example, a h-BN(hexagonal boron nitride)(0001) layer. The Ni layer of the second under layer UL2 has an FCC structure, and the h-BN layer of the third under layer UL3 has a hexagonal structure. Plane (111) of the FCC structure is equivalent to plane (0001) of the hexagonal structure. Also, a lattice constant $a_{Ni-Ni}$ of the Ni(111) layer is 2.492 Å, and lattice constants $a_{B-B}$ and $a_{N-N}$ of a h-BN(0001) layer are about 2.50 Å, that is, they are very similar to one another. Thus, the h-BN(0001) layer may be epitaxially grown on the Ni(111) layer.

A graphene GP1 has a hexagonal lattice structure, that is, a lattice structure equivalent to (0001) of the h-BN layer. Also, a lattice constant $a_{C-C}$ of the graphene GP1 is 2.46 Å, which is similar to the lattice constants $a_{B-B}$ and $a_{N-N}$ of the h-BN (0001) layer, which is 2.50 Å.

Figure 3A:
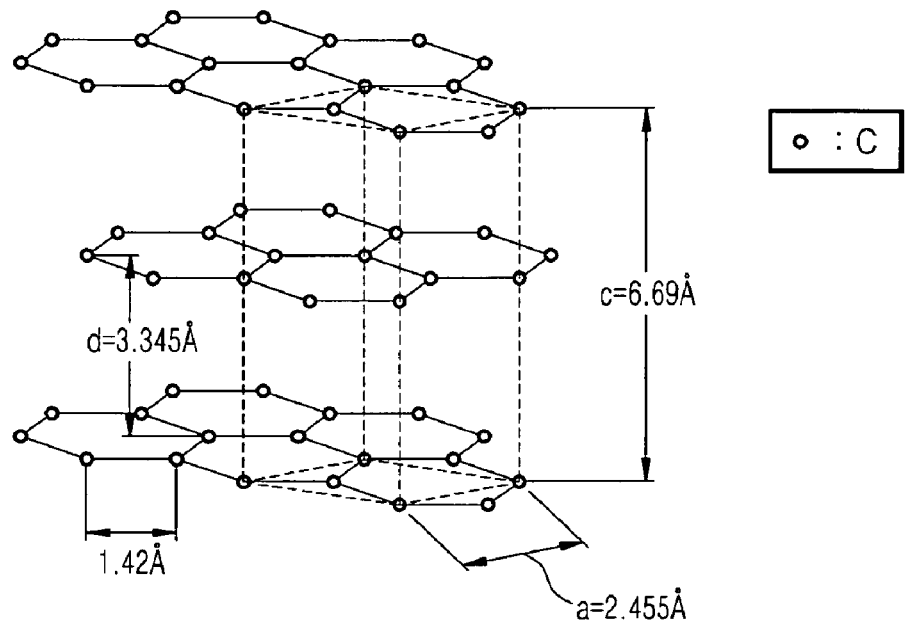
FIGS. 3A and 3B illustrate the crystalline structure of a graphene and a h-BN(0001) layer, respectively.
Figure 3B:
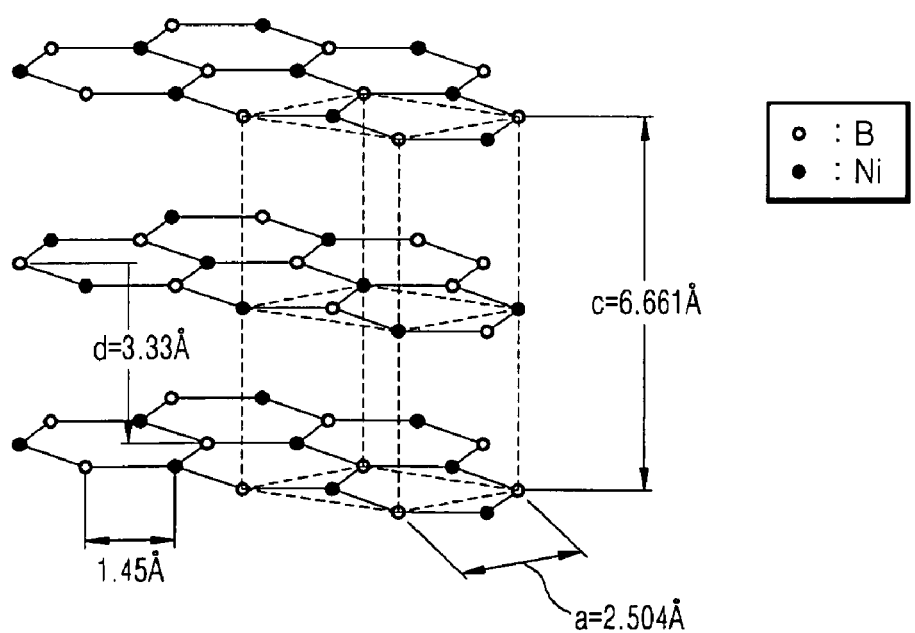

FIGS. 3A and 3B illustrate the crystalline structures of three graphene layers and the h-BN(0001) layer, respectively.

Referring to FIGS. 3A and 3B, the crystalline structures of the three graphene layers and the h-BN(0001) layer are very similar.

Accordingly, the graphene GP1 of FIG. 1 can be epitaxially grown on the h-BN(0001) layer which is the third under layer UL3. The graphene GP1 may be patterned in predetermined shapes, and the first under layer UL1 or the first under layer UL1 and the second under layer UL2 or the first through third under layers UL1, UL2, and UL3 therebelow may also be patterned in the same or different shapes to the graphene GP1.

In FIG. 1, it is preferable to insert the second under layer UL2 since the second under layer UL2 reduces the formation temperature of the third under layer UL3 and helps the third under layer UL3 grow easily. Similarly, since the second under layer UL2 is easily epitaxially grown on the first under layer UL1, it is preferable to include the first under layer UL1. However, according to circumstances, the first under layer UL1 or the first under layer UL1 and the second under layer UL2 may not be included.

Figure 4:
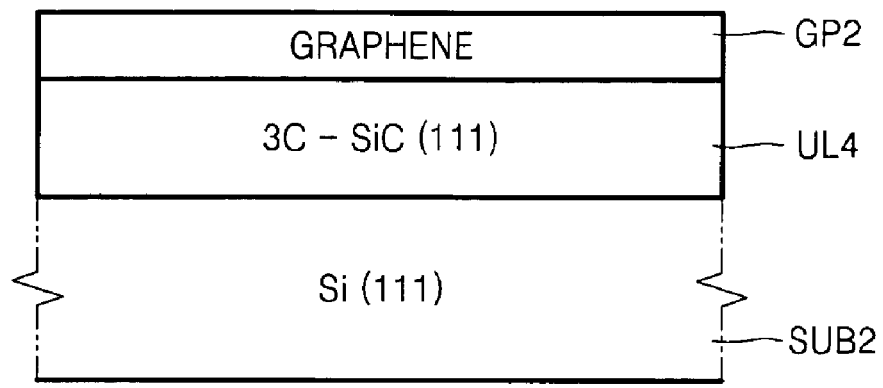
FIG. 4 is a cross-sectional view of a stack structure according to another embodiment of the present invention.

FIG. 4 is a cross-sectional view of a stack structure including an epitaxial graphene according to another embodiment of the present invention.

Figure 5:
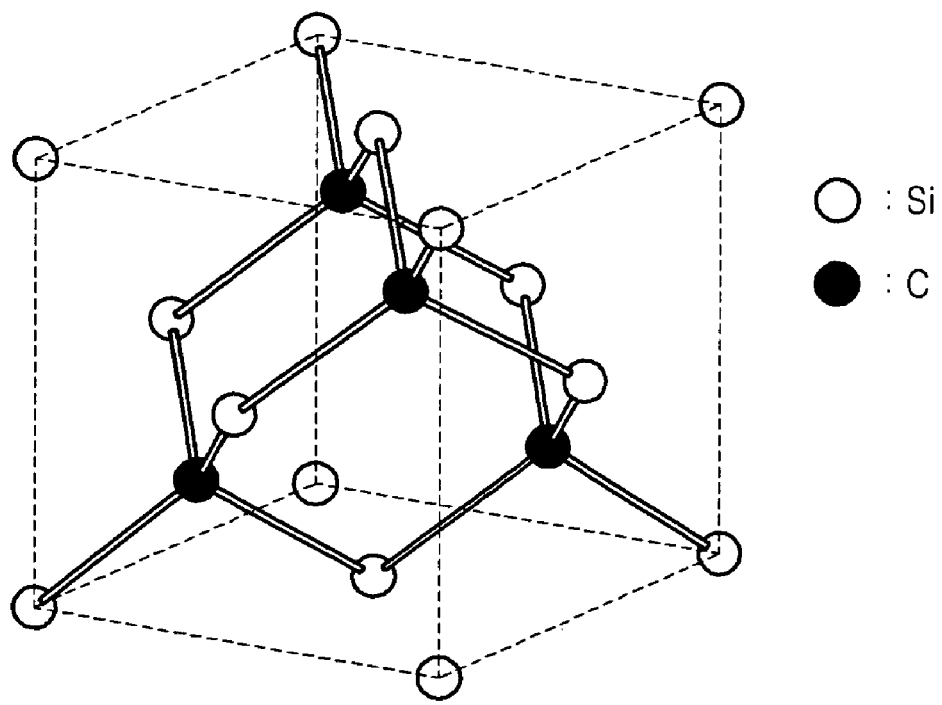
FIG. 5 illustrates the crystalline structure of 3C—SiC of FIG. 4.

Referring to FIG. 4, an under layer UL4 is formed on a Si substrate SUB2, and at least one graphene layer GP2 is formed on the under layer UL4. The Si substrate SUB2 may be a single crystal Si(111) substrate and a doping region doped with conductive impurities, but may also be an undoped region. The under layer UL4 may be an insulating layer that is epitaxially grown on the Si substrate SUB2, for example, a 3C—SiC(111) layer. 3C—SiC has a zinc-blende structure as illustrated in FIG. 5. Plane (111) of 3C—SiC having the zinc-blende structure as illustrated in FIG. 5 has the same lattice structure as (111) of Si. Accordingly, the 3C—SiC(111) layer can be epitaxially grown on the Si substrate SUB2 having a Si(111) structure. When the 3C—SiC (111) layer is epitaxially grown, the 3C—SiC(111) layer is formed such that Si atoms of the 3C—SiC(111) layer correspond one-to-one to Si atoms of the Si substrate SUB2. Also, (111) of 3C—SiC having the zinc-blende structure as illustrated in FIG. 5 has the same lattice structure as (0001) of 6H—SiC. Since graphene can be epitaxially grown on (0001) of 6H—SiC, the graphene GP2 can also be epitaxially grown on (111) of 3C—SiC layer that is equivalent to (0001) of 6H—SiC.

Like the graphene GP1 of FIG. 1, the graphene GP2 of FIG. 4 may be a layer that is patterned in predetermined shapes. Also, the under layer UL4 may be a layer that is patterned in the same shapes as or in different shapes from the graphene GP2.

The structure of FIG. 1 may be formed by sequentially growing the first through third under layers UL1, UL2, and UL3 on the substrate SUB1, and then epitaxially growing the graphene GP1 on the third under layer UL3. Similarly, the structure of FIG. 4 may be formed by forming the under layer UL4 on the substrate SUB2 and then epitaxially growing the graphene GP2 on the under layer UL4. In detail, examples of methods of growing graphenes GP1 and GP2 include thermal CVD (chemical vapor deposition), PE-CVD (plasma enhanced-CVD), MBE (molecular beam epitaxy), and ALD (atomic layer deposition), and so forth. When using the thermal CVD, the graphenes GP1 and GP2 may be formed by injecting carbon hydroxide gas such as $CH_4$, $C_2H_4$ or $C_2H_2$ or vapor of benzene ($C_6H_6$) which is in the form of liquid, and so forth at a high temperature of 700° C. or greater, into a deposition chamber. The pressure of reaction gas may be in the range of about $10^{-6}$-10 Torr, and the reaction time may be several to several tens of minutes. The reaction conditions such as the reaction temperature, the gas pressure, and reaction time may vary according to the type of the gas. When using the PE-CVD, the same reaction gas as in the case of the thermal CVD method may be used to form graphenes GP1 and GP2 at a lower temperature than in the thermal CVD method. In this case, various sources such as DC (direction current) power, RF (radio frequency) power, and microwave power, and so forth may be used to produce plasma. The deposition pressure may be in the range of about $10^{-6}$-10 Torr, according to the type of plasma sources. Meanwhile, when using the MBE method, graphenes GP1 and GP2 may be formed by maintaining the temperature of a substrate at about 600-1000° C. under a UHV (ultra high vacuum) condition, and by forming carbon flux within the deposition chamber using E-beams (electronic beams), and so forth. The h-BN (0001) layer of the third under layer UL3 may be epitaxially grown by pyrolyzing, for example, $B_3N_3H_6$ gas on the Ni(111) layer of the second under layer UL2. However, the above-described methods are just examples, and the present invention is not limited thereto. The other under layers UL1, UL2, and UL4 may be grown using a sputtering method, an evaporation method, an MBE method, and other various deposition processes.

When forming the structure of FIG. 1, the first under layer UL1 and the second under layer UL2 may be deposited on a large-surface silicon wafer and patterned, and then the third under layer UL3 and the graphene GP1 may be deposited, and after the graphene GP1 or the graphene GP1 and the third under layer UL3 may be patterned. Alternatively, the first under layer UL1, the second under layer UL2, the third under layer UL3, and the graphene GP1 are stacked on a silicon wafer, and then the graphene GP1 or the graphene GP1 and at least one layer below the graphene GP1 may be patterned. Similarly, the structure of FIG. 4 may be formed by forming the under layer UL4 on a silicon wafer and patterning the under layer UL4, and then depositing the graphene GP2 and patterning the graphene GP2 or depositing the under layer UL4 and the graphene GP2 and patterning the under layer UL4 and the graphene GP2.

Since the graphenes GP1 and GP2 are easily etched using $O_2$ plasma, minute graphene patterns having desired shapes at desired positions can be obtained using a top-down process such as typical photolithography or E-beam lithography. Thus, when manufacturing an electronic device using graphene, the problem of mis-alignment can be prevented or minimized, and uniformity and reproducibility of the electronic device can be easily obtained.

Figure 6A:
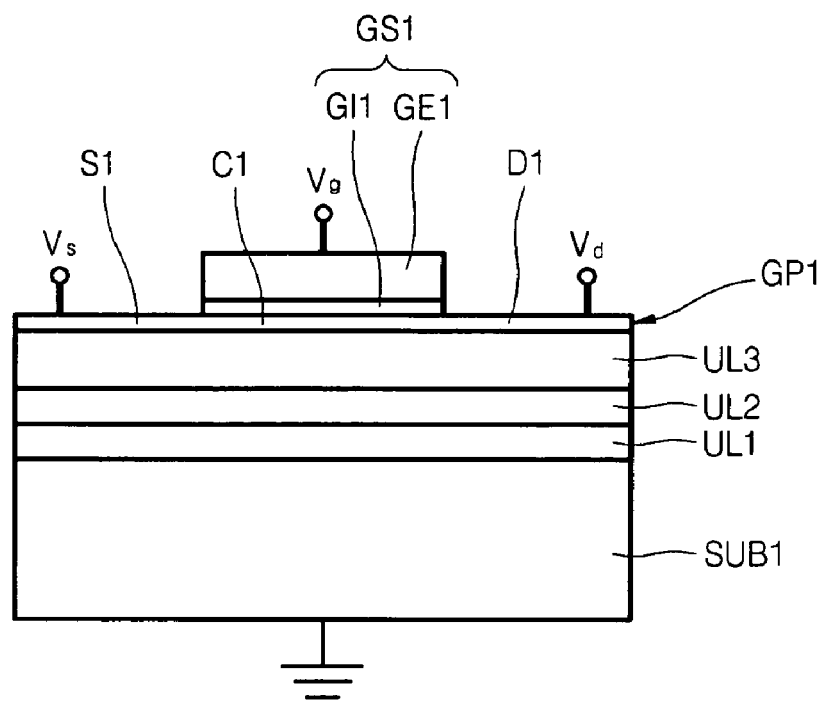
FIGS. 6A and 6B are respectively a cross-sectional view and a plan view illustrating an electronic device according to an embodiment of the present invention.

FIG. 6A is a cross-sectional view of an electronic device including a stack structure according to an embodiment of the present invention. FIG. 6A is a cross-sectional view of the electronic device cut along an A-A' line of FIG. 6B, which is a plan view of the electronic device. In the current embodiment, the electronic device is a thin film transistor having a top-gate structure.

Referring to FIG. 6A, a first under layer UL1, a second under layer UL2, and a third under layer UL3 are sequentially formed on a Si substrate SUB1, and at least one graphene layer GP1 is formed on the third under layer UL3. The Si substrate SUB1, the first under layer UL1, the second under layer UL2, the third under layer UL3, and the at least one graphene layer GP1 are the same as those illustrated in FIG. 1, and thus description thereof will not be repeated. The graphene GP1 may be a layer that is patterned in predetermined shapes. This will be described later with respect to FIG. 6B. At least a portion of the graphene GP1, for example, a center portion, may be used as a channel region C1, and a gate stack GS1 may be formed on the channel region C1. The gate stack GS1 may include a gate insulating layer GI1 and a gate electrode GE1 that are sequentially stacked on the channel region C1. A first end and a second end of the graphene GP1 each on two sides of the channel region C1 may be a source Si and a drain D1. A gate voltage Vg, a source voltage Vs, and a drain voltage Vd may be respectively applied to the gate electrode GE1, the source Si, and the drain D1, and the Si substrate SUB1 may be grounded. In this case, the Si substrate SUB1 may be a doped conductive region. If the Si substrate SUB1 is an undoped region, the first under layer UL1 or the second under layer UL2 may be grounded instead of the Si substrate SUB1.

Figure 6B:
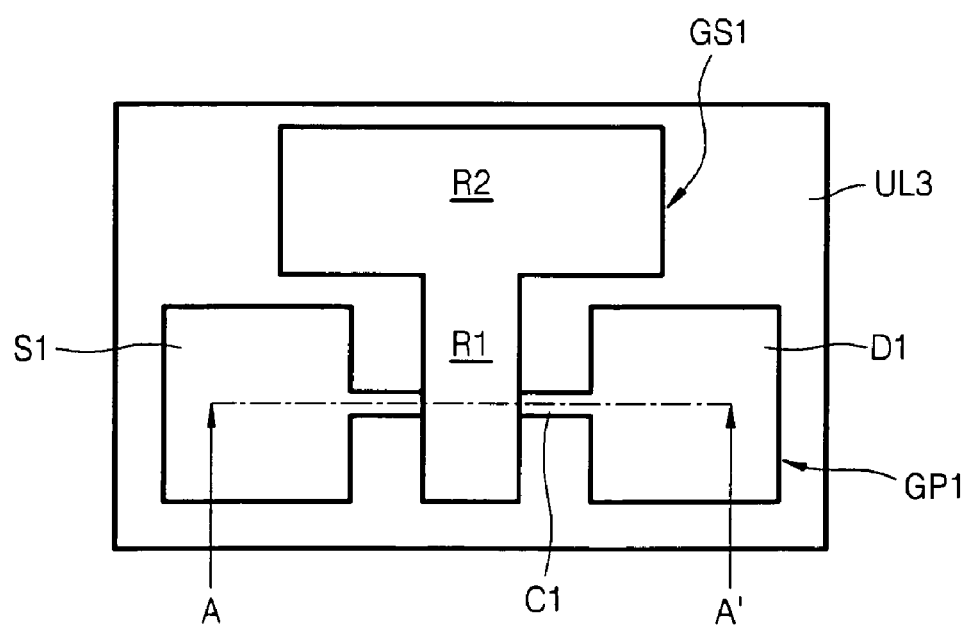

Referring to FIG. 6B, the source S1 and the drain D1 may be in the form of pads, and the channel region C1 may be a narrow line connecting the source S1 and the drain D1. Due to the physical properties of the graphene GP1, the narrow channel region C1 may have the characteristics of a semiconductor, and the broad source S1 and the drain D1 may have the properties of a metal. The gate stack GS1 may include a first region R1 in the form of a line passing above the channel region C1 and a second region R2 in the form of a pad extended from an end of the first region R1. The shape and size of the source S1, the drain D1, and the channel region C1, and the shape and size of the gate stack GS1 may vary. Also, a center portion of the graphene GP1 that is patterned in the form of a dumbbell is used as the channel region C1, and both portions of the channel region C1 are used as the source S1 and the drain D1; however, the present invention is not limited thereto. For example, graphene may be patterned in the form of one line, and the whole patterned portion may be used as a channel region, and metal layers contacting both ends of the channel region may be formed to be used as a source and a drain.

Figure 7A:
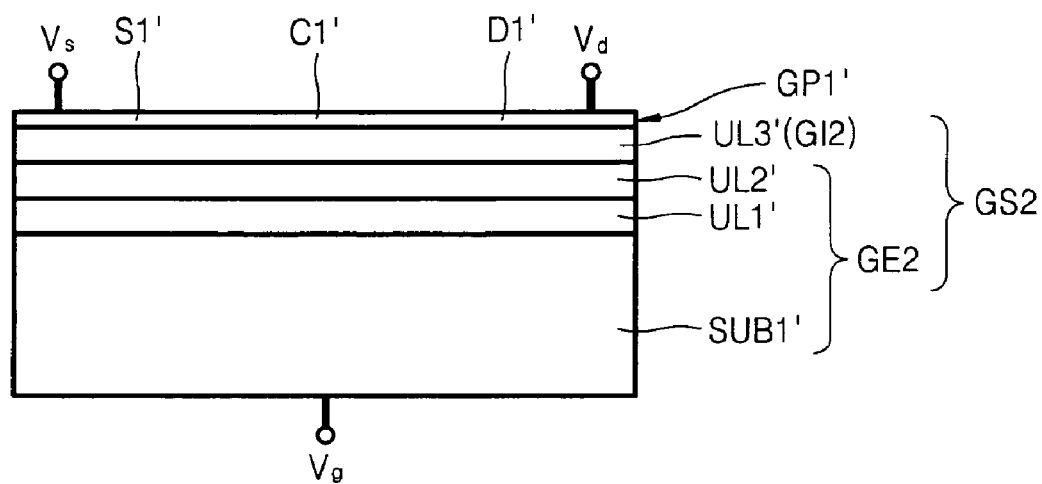
FIGS. 7A and 7B are respectively a cross-sectional view and a plan view illustrating an electronic device according to another embodiment of the present invention.

FIG. 7A is a cross-sectional view of an electronic device including a stack structure according to another embodiment of the present invention. FIG. 7A is a cross-sectional view of the electronic device cut along a B-B' line of FIG. 7B, which is a plan view of the electronic device. In the current embodiment, the electronic device is a thin film transistor having a bottom-gate structure.

Referring to FIG. 7A, a first under layer UL1', a second under layer UL2', and a third under layer UL3' are sequentially formed on a Si substrate SUB1', and at least one graphene GP1' is formed on the third under layer UL3'. The Si substrate SUB1', the first under layer UL1', the second under layer UL2', the third under layer UL3', and the at least one graphene GP1' may be the same as the Si substrate SUB1, the first under layer UL1, the second under layer UL2, the third under layer UL3, and the at least one graphene GP1 illustrated in FIG. 1. The first under layer UL1' and the second under layer UL2' may be metal layers, for example, Cu layer and Ni layer, respectively, and thus the first under layer UL1' and the second under layer UL2' may be included in a gate electrode GE2. Also, when the Si substrate SUB1' is a region heavily doped with conductive impurities, the Si substrate SUB1' may be included as a portion of the gate electrode GE2. When the Si substrate SUB1' is an undoped region, the first under layer UL1' and the second under layer UL2' except the Si substrate SUB1' may be used as a gate electrode. The third under layer UL3' may be an insulating layer, for example, an h-BN layer, and thus may be used as a gate insulating layer GI2. The gate electrode GE2 and the gate insulating layer GI2 may constitute a gate stack GS2. A gate voltage Vg, a source voltage Vs, and a drain voltage Vd may be respectively applied to the Si substrate SUB1', a source S1', and a drain D1'. When the Si substrate SUB1' is an undoped region, a gate voltage Vg may be applied to the first under layer UL1' or the second under layer UL2' instead of the Si substrate SUB1'.

Figure 7B:
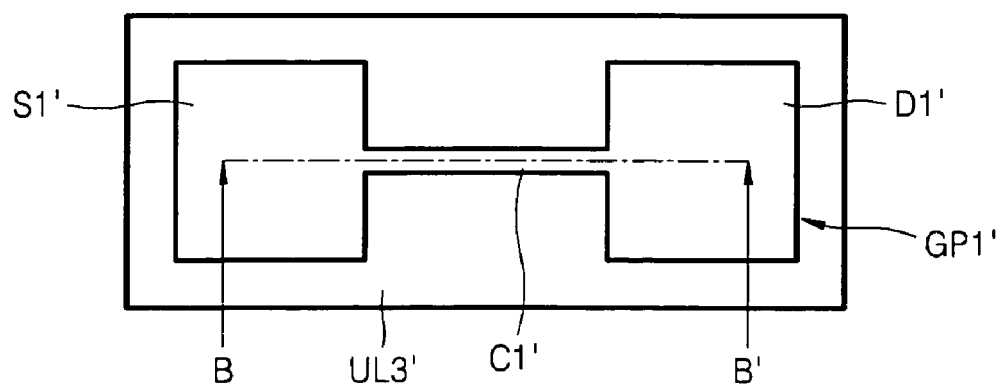

Referring to FIG. 7B, the plane structure of the graphene GP1' may be similar to the plane structure of the graphene GP1 of FIG. 6B. That is, two ends of the graphene GP1' may be respectively the source S1' and the drain D1' in the form of pads, and a center portion of the graphene GP1' may be a channel region C1' in the form of a narrow line. The narrow channel region C1' has the characteristics of a semiconductor, and thus may be gated by a voltage of the gate electrode GE2 (see FIG. 7A). On the other hand, since the broad source S1' and the drain D1' have metal properties, they are not gated by a voltage of the gate electrode GE2 (see FIG. 7A). Thus, even when the size of the gate electrode GE2 (see FIG. 7A) is greater than the graphene GP1', there may be no problem with the operation of the electronic device.

The third under layer UL3', or the third under layer UL3' and the second under layer UL2', or the first through third under layers UL1' through UL3' illustrated in FIG. 7A may be patterned in the same or similar shapes as the graphene GP1' illustrated in FIG. 7B. Also, the shape and size of the source S1', the drain D1', and the channel region C1', and the shape and size of the gate stack GS2 may be varied.

Figure 8:
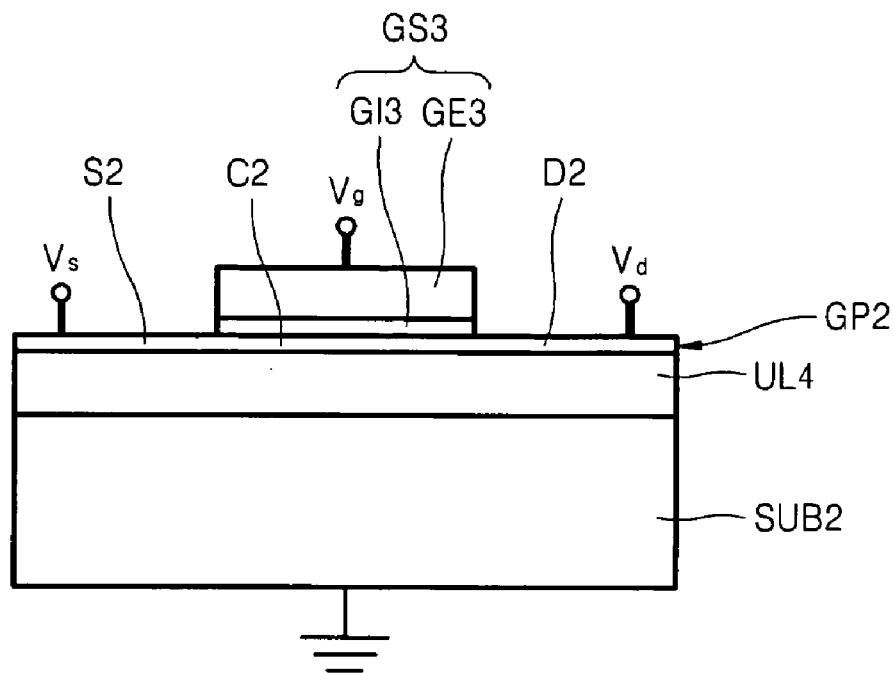
FIGS. 8 and 9 are cross-sectional views illustrating an electronic device according to another embodiments of the present invention.
Figure 9:
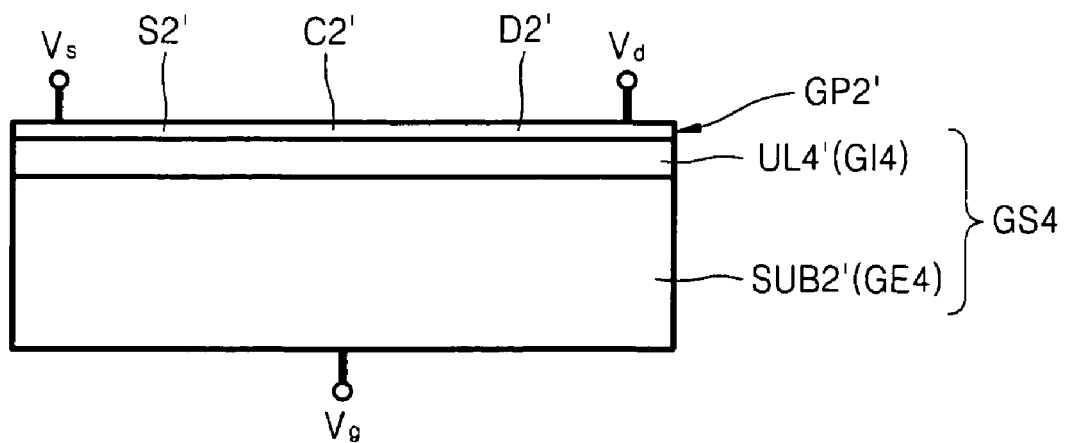

FIGS. 8 and 9 are cross-sectional views illustrating an electronic device according to another embodiments of the present invention. The stack structure of FIG. 4 is included in these embodiments. FIG. 8 illustrates a thin film transistor having a top-gate structure that is similar to that of FIG. 6A, and FIG. 9 illustrates a thin film transistor having a bottom-gate structure that is similar to that of FIG. 7A.

Referring to FIG. 8, an under layer UL4 and at least one graphene layer GP2 are stacked on a Si substrate SUB2. The structure from the Si substrate SUB2 to the graphene GP2 may be the same as the stack structure of FIG. 4. The plane structure of the graphene GP2 may be the same as the graphene GP1 of FIG. 6B. That is, the graphene GP2 may be a layer that is patterned in the form of a dumbbell, and two ends of the graphene GP2 may be respectively a source S2 and a drain D2 in the form of pads, and a region between the source S2 and the drain D2 may be a narrow channel region C2. A gate stack GS3 may be formed on the channel region C2 of the graphene GP2. The gate stack GS3 may include a gate insulating layer GI3 and a gate electrode GE3 that are sequentially stacked. The plane structure of the gate stack GS3 may be the same as the gate stack GS1 of FIG. 6B. A gate voltage Vg, a source voltage Vs, and a drain voltage Vd may be respectively applied to the gate electrode GE3, the source S2, and the drain D2, and the Si substrate SUB2 may be grounded.

Referring to FIG. 9, an under layer UL4' and at least one graphene layer GP2' are stacked on a Si substrate SUB2'. The structure from the Si substrate SUB2' to the graphene GP2' may be the same as the structure from the Si substrate SUB2 to the graphene GP2 of FIG. 8. Similar to the graphene GP1 of FIG. 6B, the graphene GP2' may have a source S2' and a drain D2' respectively formed at each of two ends of the graphene GP2' and a channel region C2' in the center. The under layer UL4' may be used as a gate insulating layer GI4, and the Si substrate SUB2' may be used as a gate electrode GE2. That is, the under layer UL4' and the Si substrate SUB2' may constitute a gate stack GS4. In this case, the Si substrate SUB2' is a doped conductive region. A gate voltage Vg, a source voltage Vs, and a drain voltage Vd may be respectively applied to the Si substrate SUB2', the source S2', and the drain D2'.

The thin film transistors illustrated in FIGS. 6A, 6B, 7A, 7B, 8, and 9 may be manufactured using the above-described methods of forming the stack structures of FIGS. 1 and 4 and a manufacturing method of a typical semiconductor device.

Although the stack structures of FIGS. 1 and 4 applied to the thin film transistors of FIGS. 6A, 6B, 7A, 7B, 8, and 9 have been described, the present invention is not limited thereto. That is, the graphenes GP1 and GP2 of the stack structures of FIGS. 1 and 4 may be applied for various purposes of various electronic devices. For example, the graphenes GP1 and GP2 may be used as wirings, electrodes, inductors, sensor layers, or other elements in a predetermined electronic device.

As described above, according to the embodiments of the present invention, graphene can be epitaxially grown on a Si substrate. The surface area of the epitaxailly grown graphene is determined according to the surface area of the Si substrate or the surface area of an under layer formed on the Si substrate, and thus a large surface epitaxial graphene can be easily obtained. The graphene can be used by patterning in desired shapes corresponding to purpose of use. Accordingly, according to the embodiments of the present invention, electronic devices using the graphene can be easily realized. In particular, since a Si substrate is used as a substrate of various electronic devices, the graphenes formed according to the embodiments of the present invention and structures including the graphenes can be easily applied to various electronic devices.

While the present invention has been particularly shown and described with reference to exemplary embodiments thereof, the exemplary embodiments should be considered in descriptive sense only and not for purposes of limitation. For example, it will be understood by those skilled in the art that various changes in form and details of the elements and structures of FIGS. 1, 4, 6A, 6B, 7A, 7B, 8, and 9 of the present invention may be made. In detail, a SOI (silicon on insulator) substrate may be used as the substrates SUB1 and SUB2, and a thin film transistor having a dual-gate structure in which a top-gate and a bottom-gate are included together can also be realized. Therefore, the scope of the invention is defined not by the embodiments of the invention but by the appended claims.

What is claimed is:

1. A stack structure comprising:
   a Si(110) substrate;
   a hexagonal boron nitride (h-BN) (0001) under layer formed on the Si(110) substrate; and
   at least one epitaxial graphene layer formed on the under layer.

2. The stack structure of claim 1, further comprising a Ni(111) layer between the Si substrate and the under layer.

3. The stack structure of claim 2, further comprising a Cu(111) layer between the Si substrate and the Ni(111) layer.

4. The stack structure of claim 1, wherein the Si(110) substrate includes a doping region doped with conductive impurities.

5. An electronic device comprising the stack structure of claim 1.

6. The electronic device of claim 5, wherein the at least one epitaxial graphene layer is used as a wiring, an electrode, an inductor, or a sensor layer.

7. The electronic device of claim 5, wherein the electronic device includes the at least one epitaxial graphene layer as a channel layer.

8. The electronic device of claim 7, wherein the transistor comprises:
   a source and a drain each contacting different ends of the channel layer;
   a gate insulating layer formed on the channel layer; and
   a gate electrode formed on the gate insulating layer.

9. The electronic device of claim 7, wherein the transistor comprises a source and a drain each contacting different ends of the channel layer,
   wherein the under layer is used as a gate insulating layer, and
   the Si substrate under the gate insulating layer is used as a gate electrode.

10. The electronic device of claim 7, wherein the transistor further comprises:
    a source and a drain each contacting different ends of the channel layer; and
    a conductive layer formed between the Si substrate and the under layer to be used as a gate electrode,
    wherein the under layer is used as a gate insulating layer.

11. The electronic device of claim 10, wherein the conductive layer comprises a Ni(111) layer.

12. The electronic device of claim 11, wherein the conductive layer further comprises a Cu(111) layer under the Ni(111) layer.

13. The electronic device of claim 7, wherein the transistor further comprises:
    a source and a drain each contacting different ends of the channel layer; and
    a conductive layer between the Si substrate and the under layer,
    wherein the under layer is used as a gate insulating layer, and
    the conductive layer and the Si substrate under the conductive layer are used as gate electrodes.

14. The electronic device of claim 13,
    wherein the conductive layer comprises a Ni(111) layer.

15. The electronic device of claim 14, wherein the conductive layer further comprises a Cu(111) layer under the Ni(111) layer.

16. The electronic device of claim 7, wherein the transistor further comprises a source and a drain each contacting different ends of the channel layer, and
    the source and the drain are formed of the same material as the channel layer and on the under layer, and
    the width of the channel layer is smaller than the widths of the source and the drain.

17. A method of forming a stack structure, the method comprising:
    forming a hexagonal boron nitride (h-BN) (0001) under layer on a Si(110) substrate; and
    growing at least one epitaxial graphene layer on the under layer.

* * * * *